(12) United States Patent
Namba et al.

(10) Patent No.: US 8,398,817 B2
(45) Date of Patent: Mar. 19, 2013

(54) CHEMICAL-LIQUID PROCESSING APPARATUS AND CHEMICAL-LIQUID PROCESSING METHOD

(75) Inventors: Hiromitsu Namba, Koshi (JP); Jiro Higashijima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 416 days.

(21) Appl. No.: 12/690,968

(22) Filed: Jan. 21, 2010

(65) Prior Publication Data

US 2010/0181290 A1 Jul. 22, 2010

(30) Foreign Application Priority Data

Jan. 22, 2009 (JP) ................................ 2009-012098
Dec. 14, 2009 (JP) ................................ 2009-282466

(51) Int. Cl.
*C23F 1/00* (2006.01)
*C23F 1/08* (2006.01)

(52) U.S. Cl. .............................. 156/345.55; 156/345.21
(58) Field of Classification Search ............. 156/345.21, 156/345.55
See application file for complete search history.

(56) References Cited

U.S. PATENT DOCUMENTS

| | | | |
|---|---|---|---|
| 2001/0037858 A1* | 11/2001 | Taniyama et al. | 156/345 |
| 2005/0284369 A1* | 12/2005 | Miya et al. | 118/500 |
| 2009/0078484 A1* | 3/2009 | Kocijan | 180/167 |
| 2010/0181290 A1* | 7/2010 | Namba et al. | 216/92 |

FOREIGN PATENT DOCUMENTS

| | | |
|---|---|---|
| JP | 7-326569 A | 12/1995 |
| JP | 10-242114 A | 9/1998 |
| JP | 2001-149843 A | 6/2001 |
| JP | 2003-303804 A | 10/2003 |
| JP | 2004-056007 A | 2/2004 |
| JP | 2006-013107 A | 1/2006 |
| JP | 2008-118086 A | 5/2008 |

* cited by examiner

*Primary Examiner* — Sylvia R. MacArthur
(74) *Attorney, Agent, or Firm* — Abelman, Frayne & Schwab (57) ABSTRACT

Disclosed is a substrate processing apparatus to improve the etching uniformity when a back surface of a substrate is etched with a high-temperature chemical liquid. The chemical-liquid processing apparatus removes a film formed on a substrate by etching with a high-temperature chemical liquid. The apparatus includes a substrate holding mechanism to hold the substrate horizontally in a state where a back surface of the substrate faces downward, a rotating mechanism to rotate the substrate holding mechanism by a hollow rotating shaft extending vertically, a chemical-liquid discharge nozzle to supply the high-temperature chemical liquid to the back surface of the substrate by discharging the high-temperature chemical liquid upwardly, and a chemical-liquid supply mechanism to supply the chemical liquid to the chemical-liquid discharge nozzle. The chemical-liquid discharge nozzle includes a plurality of outlets discharging the high-temperature chemical liquid to a plurality of contacting places on the back surface of the substrate in different distances from the center of the back surface of the substrate, other than the center of the back surface of the substrate.

11 Claims, 7 Drawing Sheets

(c) 
HIGH-TEMPERATURE CHEMICAL LIQUID (d) 
DEIONIZED WATER(DIW)

CHEMICAL-LIQUID PROCESSING APPARATUS AND CHEMICAL-LIQUID PROCESSING METHOD

This application is based on and claims priority from Japanese Patent Application Nos. 2009-012098 and 2009-282466, filed on Jan. 22, 2009 and Dec. 14, 2009, respectively, with the Japanese Patent Office, the disclosure of which is incorporated herein in its entirety by reference.

TECHNICAL FIELD

The present disclosure relates to a chemical-liquid processing apparatus and a chemical-liquid processing method to remove a film formed on a substrate, such as a semiconductor wafer, by etching with a high-temperature chemical liquid.

BACKGROUND

A process for manufacturing a semiconductor device includes removing a film formed on a semiconductor wafer (hereinafter, simply referred to as "the wafer") that is a to-be-processed substrate by etching with a chemical liquid. For example, a SiN film used as a hard mask is removed with hydrofluoric acid or a Si-based film is removed with ammonia or an ammonia-hydrogen peroxide solution (SC1).

If such a process is performed with a single wafer etching method, a chemical liquid is supplied to the wafer while rotating the wafer held by a spin chuck. However, in etching of a back surface of the wafer, a nozzle is installed within a hollow rotating shaft that extends downward from a center of the spin chuck and the chemical liquid is upwardly discharged from the nozzle, so that the discharged chemical liquid is expanded from the center of the back surface of the wafer to the circumference to perform the chemical-liquid processing (for example, see Japanese Laid-Open Patent Publication No. Hei 07-326569).

In the above-described etching processing with the chemical liquid, the etching rate increases using a high-temperature chemical liquid having a temperature of, for example, 50° C. or higher, higher than the room temperature for increasing processing throughput. However, as disclosed in Japanese Laid-Open Patent Publication No. Hei 07-326569, if the high-temperature chemical liquid is discharged to the center of the back surface of the wafer, the temperature of the chemical liquid is high at the center of the back surface of the wafer and decreases while the chemical liquid expands to the circumference of the wafer. Therefore, the etching amount increases at the center of the wafer and decreases at the circumference of the wafer, thereby incurring the low uniformity of the etching. In addition, as wafer size increases, such a low uniformity becomes more conspicuous.

SUMMARY

According to one embodiment, there is provided a chemical-liquid processing apparatus to remove a film formed on a substrate by etching with a high-temperature chemical liquid. The apparatus includes a substrate holding mechanism to hold the substrate horizontally in a state where a back surface of the substrate faces downward, a rotating mechanism to rotate the substrate holding mechanism by a hollow rotating shaft extending vertically, a chemical-liquid discharge nozzle to supply the high-temperature chemical liquid to the back surface of the substrate by discharging the high-temperature chemical liquid upwardly, and a chemical-liquid supply mechanism to supply the chemical liquid to the chemical-liquid discharge nozzle. The chemical-liquid discharge nozzle includes a plurality of outlets discharging the high-temperature chemical liquid to a plurality of contacting places on the back surface of the substrate in different distances from the center of the back surface of the substrate, other than the center of the back surface of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 5 (*a*) to 5 (*f*) are views illustrating the processing operation of the chemical-liquid processing apparatus of FIG. 1.

DETAILED DESCRIPTION

In the following detailed description, reference is made to the accompanying drawings, which form a portion hereof. The illustrative embodiments described in the detailed description, drawings, and claims are not meant to be limiting. Other embodiments may be utilized, and other changes may be made, without departing from the spirit or scope of the subject matter presented here.

The present disclosure provides a substrate processing apparatus and a substrate processing method for increasing the uniformity of the etching when a back surface of a substrate is etched with a high-temperature chemical liquid.

According to one embodiment, there is provided a chemical-liquid processing apparatus to remove a film formed on a substrate by etching with a high-temperature chemical liquid. The apparatus includes a substrate holding mechanism to hold the substrate horizontally in a state where a back surface of the substrate faces downward, a rotating mechanism to rotate the substrate holding mechanism by a hollow rotating shaft extending vertically, a chemical-liquid discharge nozzle to supply the high-temperature chemical liquid to the back surface of the substrate by discharging the high-temperature chemical liquid upwardly, and a chemical-liquid supply mechanism to supply the chemical liquid to the chemical-liquid discharge nozzle. The chemical-liquid discharge nozzle includes a plurality of outlets discharging the high-temperature chemical liquid to a plurality of contacting places on the back surface of the substrate in different distances from the center of the back surface of the substrate, other than the center of the back surface of the substrate.

The chemical-liquid discharge nozzle may include a nozzle hole installed within the rotating shaft and extending vertically. The outlets are connected with the nozzle hole.

At least one of the outlets may be configured so that the chemical liquid discharged from said at least one of the outlets reaches the center of the back surface of the substrate by the expansion on the back surface of the substrate after contacting with the back surface of the substrate. The outlets may be configured so that thermal hysteresis of the back surface of the substrate becomes uniform in the back surface of the substrate as the chemical liquid discharged from the outlets contacts with and expands on the back surface of the substrate. The outlets may be configured so that one of the contacting places is where the temperature of the chemical liquid expanded from another contacting place starts to decrease.

An upper end of the chemical-liquid discharge nozzle may be configured with a substrate supporting part. The chemical-liquid discharge nozzle may be installed to move up and down. The outlets may be formed in the substrate supporting part. The apparatus may be configured so that the substrate is transferred on the substrate supporting part at a carrying position where the chemical-liquid discharge nozzle moves up. The chemical-liquid discharge nozzle may be located at a lower position during the processing and may move up to lift the substrate to the carrying position after the processing.

The apparatus may further include a front-surface chemical-liquid discharge nozzle to discharge the chemical liquid to a front surface of the substrate. The front-surface chemical-liquid discharge nozzle may be installed above the substrate held by the substrate holding mechanism to scan the substrate. Also, the apparatus may further include a front-surface chemical-liquid supply mechanism to supply the chemical liquid to the front-surface chemical-liquid discharge nozzle. The apparatus may be configured so that the high-temperature chemical liquid is supplied to the front and back surfaces of the substrate to perform the etching.

According to another embodiment, there is provided a chemical-liquid processing method to remove a film formed on a substrate by etching with a high-temperature chemical liquid. The method includes holding the substrate horizontally in a state where the back surface of the substrate faces downward, and supplying the high-temperature chemical liquid to the back surface of the substrate by discharging the high-temperature chemical liquid upwardly while the substrate is rotated horizontally. The high-temperature chemical liquid is supplied so that the high-temperature chemical liquid contacts with a plurality of contacting places on the back surface of the substrate in different distances from the center of the back surface of the substrate, other than the center of the back surface of the substrate.

At least one of the contacting places may be located so that the chemical liquid expands from said at least one of the contacting places and reaches the center of the back surface of the substrate. The contacting places may be located so that thermal hysteresis of the back surface of the substrate becomes uniform in the back surface of the substrate as the chemical liquid contacts with and expands on the back surface of the substrate. One of the contacting places may be where the temperature of the chemical liquid expanded from another contacting place starts to decrease.

The method may further include discharging the high-temperature chemical liquid to a front surface of the substrate as the high-temperature chemical liquid is supplied to the back surface of the substrate. Also, the method may further include scanning a front surface of the substrate over discharging the high-temperature chemical liquid to the front surface of the substrate as the high-temperature chemical liquid is supplied to the back surface of the substrate.

According to the present disclosure, the high-temperature chemical liquid is supplied to the back surface of the substrate through discharging the high-temperature chemical liquid upward by the chemical-liquid discharge nozzle while the substrate is rotated horizontally and the back surface of the substrate faces downward. The chemical liquid is discharged through the chemical-liquid discharge nozzle and the plurality of outlets is formed so that the chemical liquid contacts with the places in different distances from the center of the back surface of the substrate, other than the center of the back surface of the substrate. Accordingly, it is possible to prevent from increasing the temperature of the center of the back surface of the substrate caused by contacting the high-temperature chemical liquid with the center of the back surface of the substrate and the high-temperature chemical liquid can uniformly reach the entire surface of the substrate within a short time. As a result, it is possible to reduce the temperature difference in the back surface of the substrate and to perform the etching of high uniformity with the high-temperature chemical liquid allowing a high etching rate.

Hereinafter, embodiments of the present disclosure will be described in detail with reference to the accompanying drawings.

First Embodiment

The first embodiment will be described.

Figure 1:
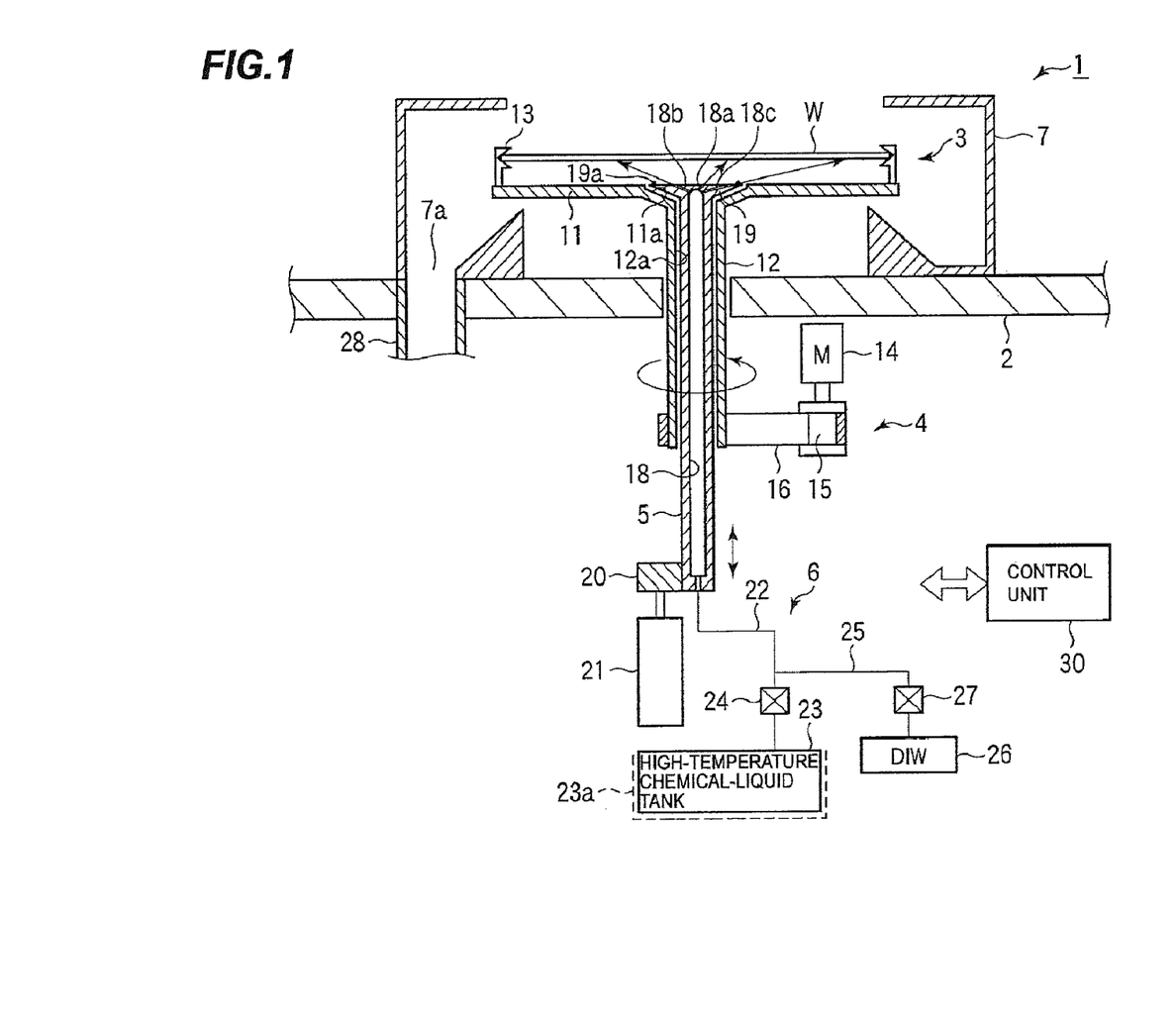
FIG. 1 is a cross-sectional view schematically illustrating a chemical-liquid processing apparatus according to a first embodiment.

FIG. 1 is a cross-sectional view schematically illustrating a chemical-liquid processing apparatus according to the first embodiment. In the present embodiment, a semiconductor wafer (hereinafter, simply referred to as "the wafer") is used as the substrate, and a film formed on a back surface of the wafer is removed by etching with a high-temperature chemical liquid.

The chemical-liquid processing apparatus 1 includes a chamber (not shown), a base plate 2 serving as a base of the chamber, a spin chuck 3 (a substrate holding mechanism) installed within the chamber, a rotating mechanism 4 to rotate spin chuck 3, a chemical-liquid discharge nozzle 5 to discharge the chemical liquid, a chemical-liquid supply mechanism 6 to supply the chemical liquid to chemical-liquid discharge nozzle 5, and a drain cup 7 to receive the drained liquid.

Spin chuck 3 includes a rotating plate 11, a rotating shaft 12 connected to a center part of rotating plate 11, and three holding pins 13 attached to a periphery of rotating plate 11 at a uniform distance to hold a wafer W. Holding pins 13 are configured to maintain a state where wafer W rises from rotating plate 11. Holding pins 13 can move between a holding position where wafer W is held and a releasing position where holding pins 13 are pivoted in a rear direction for wafer W to be released from the holding state. Spin chuck 3 horizontally holds wafer W, in which the back surface of wafer W faces downward. Herein, the back surface of wafer W refers to a surface on which a device of wafer W is not formed.

Rotating mechanism 4 includes a motor 14, a pulley 15 rotated by motor 14, and a belt 16 wounded around lower ends of pulley 15 and rotating shaft 12. Motor 14 rotates rotating shaft 12 through pulley 15 and belt 16.

Rotating shaft 12 is shaped like a (hollow) cylinder, and extends downwardly through base plate 2. A circular hole 11a is formed at the center part of rotating plate 11, and communicated with a hole 12a in rotating shaft 12. Further, chemical-liquid discharge nozzle 5 is installed to be movable up and down in an inside of holes 12a and 11a.

Figure 2:
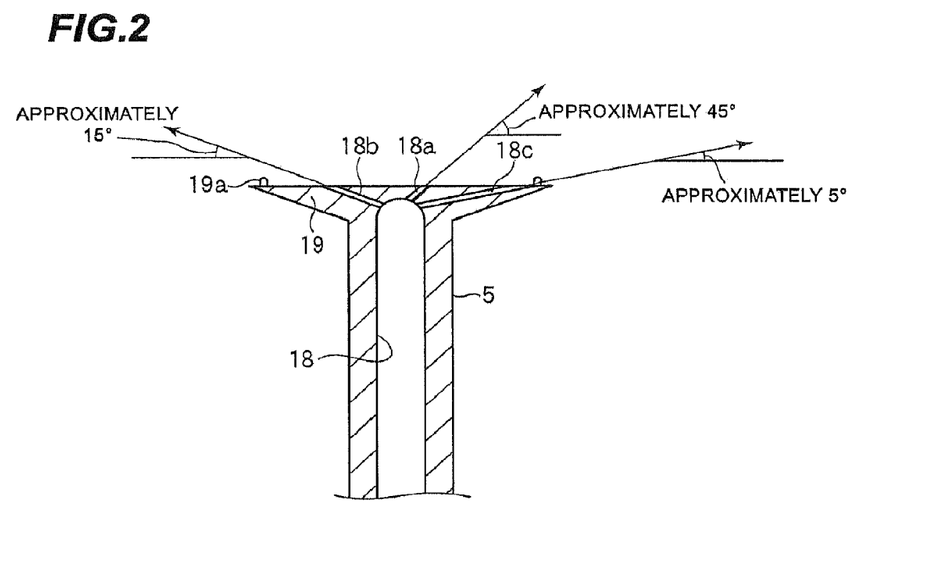
FIG. 2 is a cross-sectional view illustrating a chemical-liquid discharge nozzle used in the chemical-liquid processing apparatus of FIG. 1.
Figure 3:
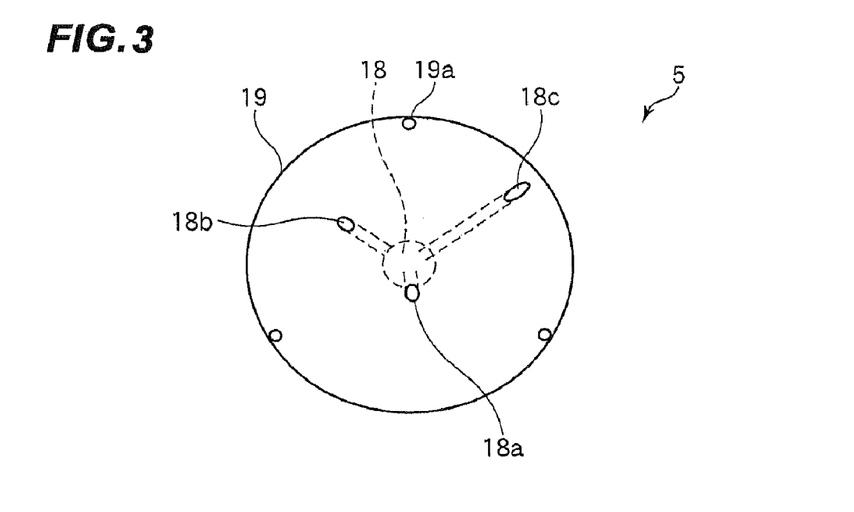
FIG. 3 is a plan view illustrating a chemical-liquid discharge nozzle used in the chemical-liquid processing apparatus of FIG. 1.

As shown in FIGS. 2 and 3, chemical-liquid discharge nozzle 5 includes a nozzle hole 18 extending along a longitudinal direction of chemical-liquid discharge nozzle 5 within chemical-liquid discharge nozzle 5. Three outlets 18a, 18b, and 18c are connected to a wafer supporting part 19 constituting an upper end of nozzle hole 18. Three outlets 18a, 18b, and 18c communicate with nozzle hole 18. The chemical liquid is supplied upwardly from chemical-liquid supply mechanism 6 through nozzle hole 18, and discharged from three outlets 18a, 18b, and 18c to the back surface of wafer W. Three outlets 18a, 18b, and 18c are configured so that the chemical liquid contacts with places on the back surface of wafer W in different distances from the center of the back surface of wafer W, other than the center of the back surface of wafer W.

For example, outlet 18a is inclined at an angle of approximately 45°, and allows the discharged chemical liquid to contact with a place close to the center of the back surface of wafer W. Outlet 18c is inclined at an angle of 5°, and allows the discharged chemical liquid to contact with a place close to a circumference of the back surface of wafer W. Outlet 18b is inclined at an angle of 15°, and allows the discharged chemical liquid to contact with the middle between the places to which the chemical liquid is discharged from two outlets 18a and 18c.

Outlets 18a, 18b, and 18c may be configured so that the chemical liquid rapidly covers an entire area of the back surface of wafer W by the expansion of the chemical liquid after the chemical liquid contacts with the back surface of wafer W. For example, if a diameter of wafer W is 300 mm, the places where the chemical liquid contacts may be away from the center of wafer W by 15 mm, 60 mm, and 130 mm, respectively.

At least one of the outlets, for example, outlet 18a discharging the chemical liquid to a place closest to the center of the back surface of the wafer W, may be formed so that the chemical liquid discharged from said at least one of the outlets contacts with the place on the back surface of the wafer W, expands on the back surface of the wafer W, and reaches the center of the back surface of wafer W. Therefore, the center of the back surface of wafer W can be cleaned by the expansion of the chemical liquid although the chemical liquid does not contact with the center of the back surface of wafer W at first.

Outlets 18a, 18b, and 18c may be formed so that thermal hysteresis of the back surface of wafer W becomes uniform in the back surface of wafer W as the chemical liquid contacts with and expands on the back surface of wafer W. When the chemical liquid discharged from one outlet contacts with and expands on the back surface of wafer W, the temperature of the contacting place is the highest and the temperature of a place in a distance from the contacting place starts to decrease. Therefore, thermal hysteresis of the back surface of wafer W can become uniform by contacting the chemical liquid from another outlet with the place where the temperature starts to decrease when the chemical liquid discharged from one outlet contacts with and expands on the back surface of wafer W.

Chemical-liquid discharge nozzle 5 also functions as a wafer elevating member and an upper end of chemical-liquid discharge nozzle 5 is configured with wafer supporting part 19 to support wafer W. Wafer supporting part 19 widens upwardly like a cup. Three wafer supporting pins 19a (only two wafer supporting pins are shown) are installed on the upper surface of wafer support part 19 to support wafer W. Further, the lower end of chemical-liquid discharge nozzle 5 is connected to a cylinder mechanism 21 through a connection member 20. Wafer W is elevated through elevating chemical-liquid discharge nozzle 5 by means of cylinder mechanism 21, and thereby loading and unloading wafer W. The position of wafer supporting part 19 can be adjusted so that the height of the upper surface of wafer supporting part 19 is substantially identical to the height of the upper surface of rotating plate 11 when the chemical liquid is supplied to wafer W.

Chemical-liquid supply mechanism 6 includes a chemical-liquid conduit 22 connected to the lower end of chemical-liquid discharge nozzle 5, a high-temperature chemical-liquid tank 23 connected to chemical-liquid conduit 22 to store the high-temperature chemical liquid, and an opening/closing valve 24 installed on chemical-liquid conduit 22. High-temperature chemical-liquid tank 23 includes a heater 23a. A controller (not shown) controls heater 23a to maintain a temperature of the chemical liquid within high-temperature chemical-liquid tank 23. Here, the high temperature refers to the temperature higher than the room temperature of 20° C. to 25° C. and generally refers to 50° C. or higher. If the temperature is too high, the chemical liquid is volatilized. Thus, the temperature may be maximally 80° C. although this can vary depending on the kinds of chemical liquids. The chemical liquid may be hydrofluoric acid (HF), ammonia, or ammonia-hydrogen peroxide solution (SC1). Hydrofluoric acid (HF) is used when the film formed on wafer W is the SiN film, and ammonia or ammonia-hydrogen peroxide solution (SC1) is used when the film formed on wafer W is the Si-based film, for example, a polysilicon film.

Chemical-liquid conduit 22 is connected to a rinsing-liquid conduit 25. Rinsing-liquid conduit 25 is connected to a deionized-water source 26. Deionized-water source 26 supplies deionized water (DIW) as the rinsing liquid. An opening/closing valve 27 is installed on rinsing-liquid conduit 25. Further, the deionized water is supplied from deionized-water source 26 to nozzle hole 18 of chemical-liquid discharge nozzle 5 through rinsing-liquid conduit 25 and chemical-liquid conduit 22. The deionized water is discharged from outlets 18a, 18b, and 18c to perform the rinsing processing with respect to the back surface of wafer W after the chemical-liquid processing.

Drain cup 7 is installed in an exterior side of rotation plate 11 to surround the periphery of wafer W held on rotating plate 11 and receive the drained liquid scattered from wafer W. A drain port 7a is formed on a bottom of drain cup 7 and is connected to a drain conduit 28 that extends downward.

Figure 4:
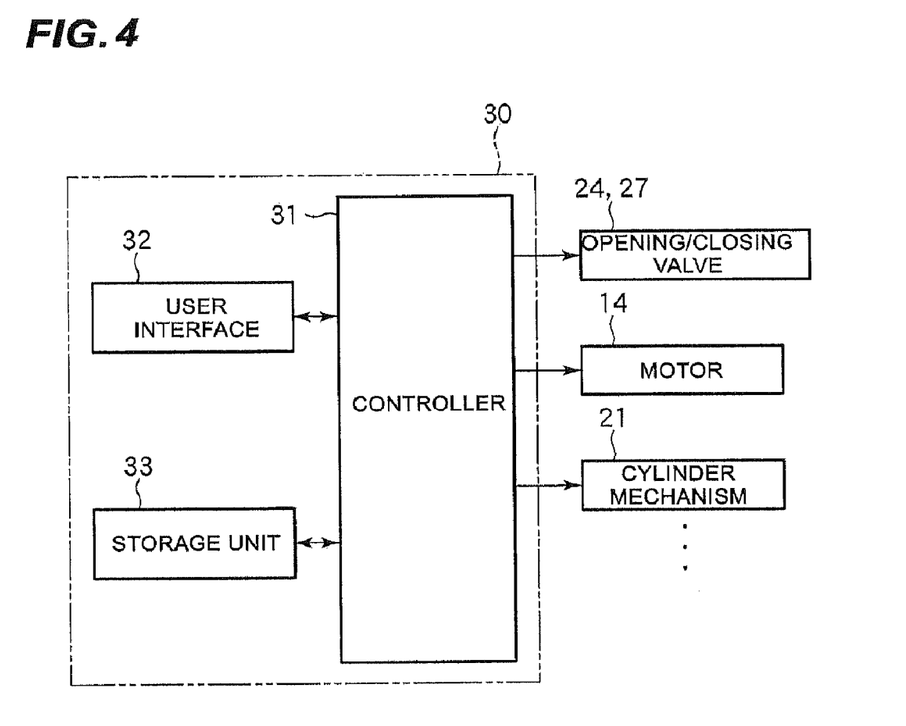
FIG. 4 is a block diagram illustrating a control unit installed in the chemical-liquid processing apparatus of FIG. 1.

Chemical-liquid processing apparatus 1 includes a control unit 30. As shown in FIG. 4, control unit 30 includes a controller 31, a user interface 32, and a storage unit 33. Controller 31 includes a microprocessor (a computer) and controls each configuration of chemical-liquid processing apparatus 1, for example, opening/closing valves 24 and 27, motor 14, and cylinder mechanism 21. User interface 32 is connected to controller 31 and includes a keyboard allowing an operator to input commands for managing chemical-liquid processing apparatus 1 and a display to visualize and indicate the operation status of chemical-liquid processing apparatus 1. Storage unit 33 is connected to controller 31 and stores a program to control a to-be-controlled object of each configuration of chemical-liquid processing apparatus 1 or a program, i.e. a processing recipe, allowing chemical-liquid processing apparatus 1 to perform processes. The processing recipe is stored in a storage medium (not shown) within storage unit 33. The storage medium may be a fixed form, such as a hard disk, or a portable form, such as CD-ROM, DVD, or flash memory. Further, the recipe may be appropriately transferred through another device, for example, an exclusive line. Controller 31 calls a processing recipe from storage unit 33 according to an instruction from user interfaces as occasion demands and executes the recipe, so that a process is performed under the control of controller 31.

Next, an operation of etching-removing the film on the back surface of wafer W by chemical-liquid processing apparatus 1 will be described.

Figure 5:
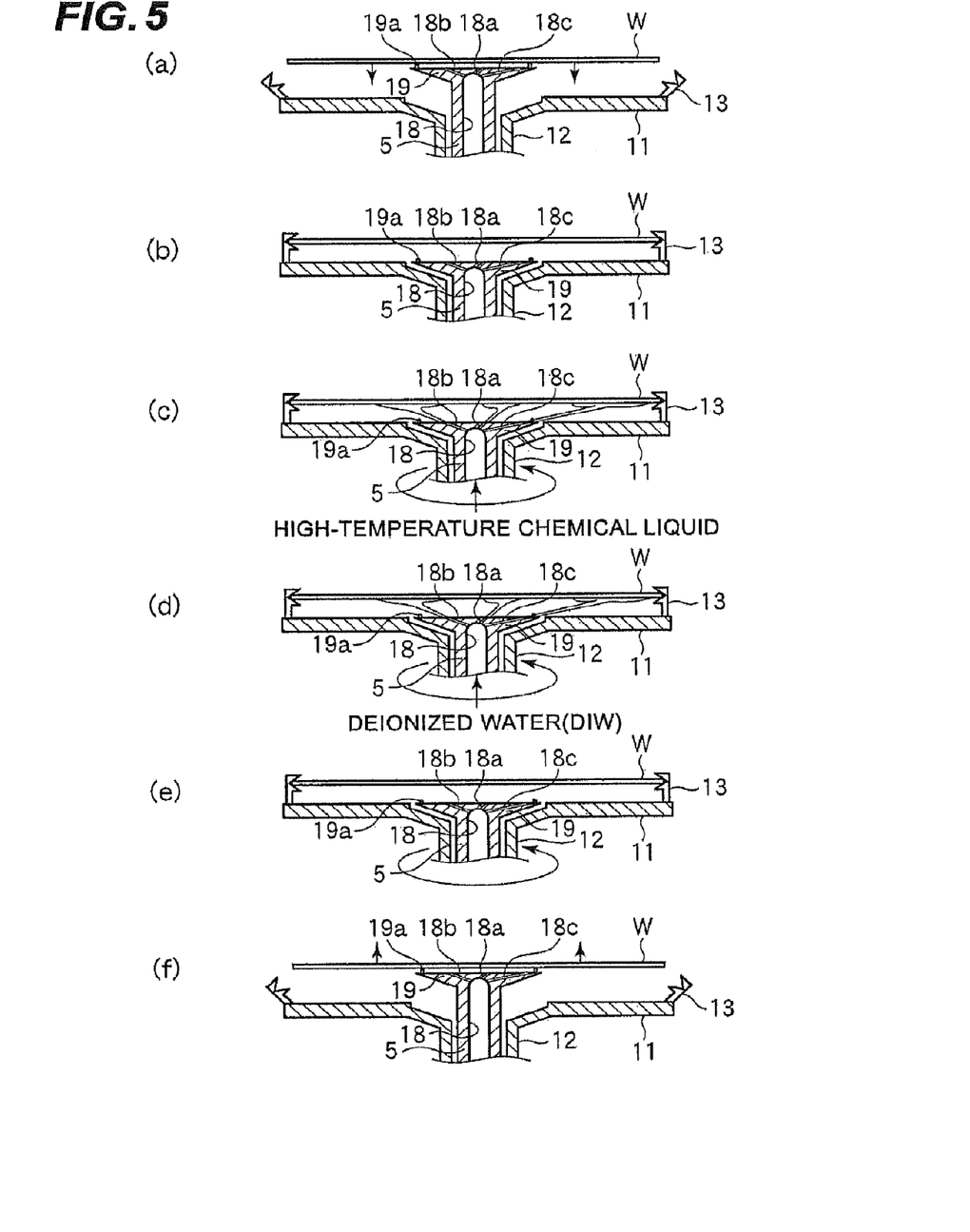

FIGS. 5 (*a*) to 5 (*f*) are views illustrating the processing operation of removing the film of the back surface of wafer W by etching.

First, as shown in FIG. 5 (*a*), in a state where chemical-liquid discharge nozzle 5 is lifted, wafer W is transferred from the carrying arm (not shown) onto supporting pin 19*a* of wafer supporting part 19. Then, as shown in FIG. 5 (*b*), chemical-liquid discharge nozzle 5 moves down to the position where wafer W can be held by holding member 13 to chuck wafer W by holding member 13.

In this state, as shown in FIG. 5 (*c*), spin chuck 3 rotates together with wafer W by rotating mechanism 4 and the high-temperature chemical liquid is supplied from chemical-liquid discharge nozzle 5 to perform the etching processing. At this time, the rotation speed of wafer W ranges from 300 rpm to 1000 rpm.

The chemical liquid is discharged from three outlets 18*a*, 18*b*, and 18*c* toward the back surface of wafer W and the chemical liquid contacting with the back surface of wafer W expands over the entire area of the back surface of wafer W according to the rotation of wafer W to progress the etching processing.

Figure 6:
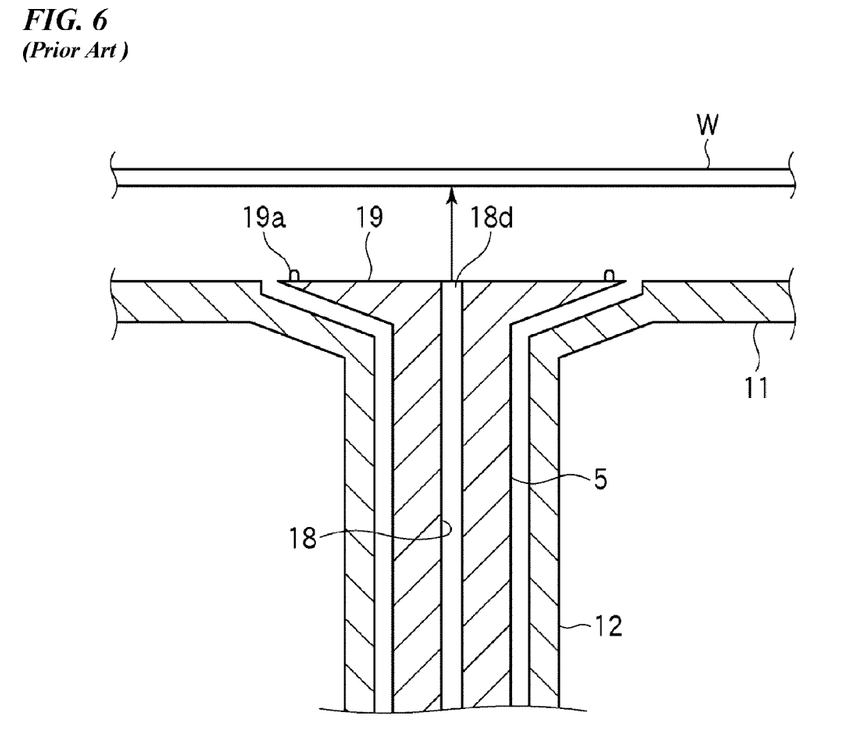
FIG. 6 is a cross-sectional view illustrating a conventional chemical-liquid discharge nozzle.

In a conventional method as shown in FIG. 6, a single outlet 18*d* is formed on a front end of nozzle hole 18 of chemical-liquid discharge nozzle 5 and the chemical liquid is discharged from outlet 18*d* to the center of the back surface of wafer W. However, when the etching processing is performed with the high-temperature chemical liquid using such a chemical-liquid discharge nozzle, the discharged high-temperature chemical liquid continuously contacts with the center of the back surface of wafer W and the heat does not escape well from the center of the back surface of wafer W. Therefore, although the temperature at the center of the back surface of wafer W increases, the temperature of the chemical liquid outwardly expanding from the center of the back surface of wafer W by the rotation of wafer W becomes lower toward the exterior side as time goes by. Further, the heat easily escapes from the circumference of the back surface of wafer W, so that the temperature of the back surface of wafer W becomes lower toward the exterior side in comparison with the center of the back surface of wafer W. Accordingly, the etching amount is greatly different between the center and the circumference of the back surface of wafer W. Particularly, the size of wafer W has been currently increasing, so that such a tendency becomes more conspicuous.

In the present embodiment, since outlets 18*a*, 18*b*, and 18*c* are formed so that the chemical liquid contacts with the places in different distances from the center of the back surface of wafer W, other than the center of the back surface of wafer W, it is possible to prevent the increase of the temperature of the specific place, for example, the center of the back surface of wafer W, and the high-temperature chemical liquid can uniformly reach the entire surface of wafer W within a short time. That is, the high-temperature chemical liquid discharged from the outlets contacts with the places, other than the center of the back surface of wafer W, and the high-temperature chemical liquid does not directly contact with the center of the back surface of wafer W but is only supplied through expansion from the places where the chemical liquid contacts.

Therefore, the temperature increase of the center of the back surface of wafer W is lessened. Further, since a plurality of outlets is provided so that the chemical liquid contacts the places in different distances from the center of wafer W, the high-temperature chemical liquid can reach the entire area of the back surface of wafer W within the short time, thereby decreasing the temperature difference in the back surface of wafer W. Therefore, the etching rate with the high-temperature chemical liquid is maintained and the variation of the etching amount in the back surface of wafer W decreases to improve the uniformity of the etching.

Outlets 18*a*, 18*b*, and 18*c* communicate with the nozzle hole of nozzle 5 installed within rotating shaft 12. Outlets 18*a*, 18*b*, and 18*c* are formed in wafer supporting part 19 constituting the upper end of chemical-liquid discharge nozzle 5 so that the chemical liquid is supplied to wafer W at desired angles, and other specific components are not required to discharge the chemical liquid. Therefore, the distance between rotating plate 11 and wafer W can become smaller. Further, the structure is simple since only outlets 18*a*, 18*b*, and 18*c* are formed at angles to connect with single nozzle hole 18 of chemical-liquid discharge nozzle 5 installed within rotating shaft 12. Furthermore, since the upper end of chemical-liquid discharge nozzle 5 is configured with wafer supporting part 19 and outlets 18*a*, 18*b*, and 18*c* are formed in wafer supporting part 19, the number of components can become lower rather than the number of components in a case where the chemical-liquid discharge nozzle, wafer supporting part, and outlets are provided separately.

After finishing the etching processing with the high-temperature chemical liquid, the supply of the high-temperature chemical liquid is stopped and, as shown in FIG. 5 (*d*), the deionized water (DIW) serving as the rinsing liquid is supplied from outlets 18*a*, 18*b*, and 18*c* of chemical-liquid discharge nozzle 5 to the back surface of wafer W to perform the rinsing processing while wafer W rotates at the rotation speed of 300 rpm to 1000 rpm. Then, as shown in FIG. 5 (*e*), the supply of the deionized water is stopped, and wafer W rotates at the rotation speed of 500 rpm to 1000 rpm to be dried by shaking off liquids. Thereafter, as shown in FIG. 5 (*f*), holding member 13 is receded, chemical-liquid discharge nozzle 5 moves up to lift wafer W by wafer supporting part 19, and wafer W is unloaded by the carrying arm (not shown).

Next, the experiment identifying the effect of the present embodiment will be described.

Herein, the example of etching the SiN film formed on the back surface of wafer W with hydrofluoric acid (HF) will be described.

Herein, the etching with hydrofluoric acid (HF) at the room temperature of 25° C. using a conventional chemical-liquid discharge nozzle that discharges the chemical liquid to the center of the back surface of the wafer (Experiment 1), the etching with hydrofluoric acid of the high temperature of 60° C. using the conventional chemical-liquid discharge nozzle (Experiment 2), and the etching with hydrofluoric acid of the high temperature of 60° C. using the chemical-liquid discharge nozzle according to the present embodiment (Experiment 3) were carried out. These experiments were performed under the conditions of a rotation speed of 1000 rpm, a supply rate of hydrofluoric acid of 1.5 l/min, and a time of 30 sec.

The etching amount was measured at 49 points of the entire area of the back surface of the wafer. The maximum value (Max), minimum value (Min), average value (Ave), range (Range), variation (Range/2 Ave) of the etching amount were represented in Table 1. As represented in Table 1, even though using the conventional chemical-liquid discharge nozzle, if the temperature of the chemical liquid was the room temperature (Experiment 1), the variation of the etching amount within the surface was small, but the etching amount itself was very small. Compared to this, in Experiment 2 where the temperature of the chemical liquid was 60° C., the etching amount itself was large, but the etching amount was large at the center and was small at the circumference of the back surface of the wafer, so that the variation of the etching amount had a very large value of 15.0%. In the meantime, in Experiment 3 of the etching with hydrofluoric acid of the high temperature of 60° C. using the chemical-liquid discharge nozzle according to the present embodiment, it was identified that the variation of the etching amount was 10.1% and the uniformity of the etching within the surface increased. Further, the average value of the etching amount was higher than that of Experiment 2. As a result, the effect of the present embodiment was identified.

TABLE 1

|  |  | Experiment 1 | Experiment 2 | Experiment 3 |
|---|---|---|---|---|
| HF Discharge rate (l/min) | | 1.5 | 1.5 | 1.5 |
| HF temperature (° C.) | | 25 | 60 | 60 |
| Outlet | | one at center | one at center | three (other than center) |
| Rotation speed (rpm) | | 1000 | 1000 | 1000 |
| Etching amount | Max (Å) | 87.6 | 775.2 | 754.0 |
| | Min (Å) | 76.6 | 579.1 | 616.7 |
| | Ave (Å) | 86.0 | 654.5 | 679.6 |
| | Range (Å) | 11.0 | 196.1 | 137.2 |
| | Range/2 Ave (%) | 6.4 | 15.0 | 10.1 |

Second Embodiment

Next, the second embodiment will be described.

Figure 7:
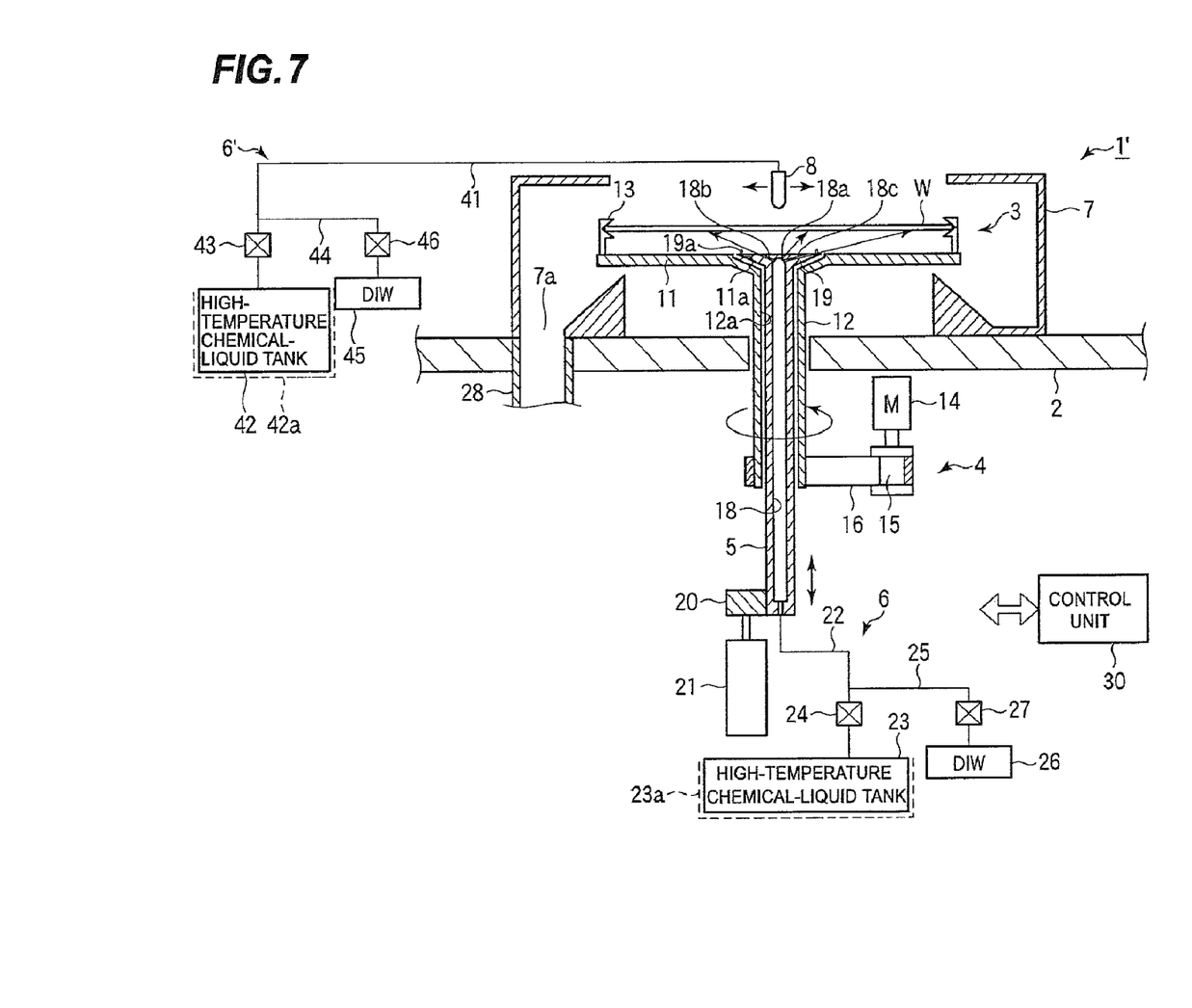
FIG. 7 is a cross-sectional view schematically illustrating a chemical-liquid processing apparatus according to a second embodiment.

FIG. 7 is a cross-sectional view schematically illustrating the chemical-liquid processing apparatus according to the second embodiment. In the present embodiment, the chemical-liquid processing apparatus is front and back surfaces processing apparatus that etches the back surface of wafer W like the first embodiment and simultaneously etches the front surface (a surface on which the device is formed) of wafer W. The elements of the present embodiment identical to those of the chemical-liquid processing apparatus of FIG. 1 are designated by the same reference numerals and their descriptions will be omitted.

A chemical-liquid processing apparatus 1' according to the present embodiment further includes a front-surface chemical-liquid discharge nozzle 8 to supply the high-temperature chemical liquid to the front surface of wafer W and a front-surface chemical-liquid supply mechanism 6' to supply the high-temperature chemical liquid to front-surface chemical-liquid discharge nozzle 8 in addition to chemical-liquid processing apparatus 1 according to the first embodiment shown in FIG. 1.

Front-surface chemical-liquid discharge nozzle 8 is installed above the front surface of wafer W and can scan by a driving mechanism (not shown). Further, front-surface chemical-liquid supply mechanism 6' includes a chemical-liquid conduit 41 connected to front-surface chemical-liquid discharge nozzle 8, a high-temperature chemical-liquid tank 42 connected to chemical-liquid conduit 41 to store the high-temperature chemical liquid, and an opening/closing valve 43 installed on chemical-liquid conduit 41. A heater 42a is installed on high-temperature chemical-liquid tank 42 and a controller (not shown) controls heater 42a to maintain a temperature of the chemical liquid within high-temperature chemical-liquid tank 42.

Chemical-liquid conduit 41 is connected with a rinsing-liquid conduit 44. Rinsing-liquid conduit 44 is connected with a deionized-water source 45. Deionized-water source 45 supplies deionized water (DIW) serving as the rinsing liquid. Rinsing-liquid conduit 44 includes an opening/closing valve 46. Further, the deionized water is supplied from deionized-water source 45 to front-surface chemical-liquid discharge nozzle 8 through rinsing-liquid conduit 44 and chemical-liquid conduit 41 and the deionized water is discharged from front-surface chemical-liquid discharge nozzle 8, so that the rinsing processing of the front surface of wafer W is performed after the chemical-liquid processing.

Since chemical-liquid processing apparatus 1' according to the second embodiment includes front-surface chemical-liquid discharge nozzle 8 capable of scanning, it is possible to discharge the high-temperature chemical liquid to the front surface of wafer W while front-surface chemical-liquid discharge nozzle 8 scans to ensure the good uniformity of the temperature of the front surface of wafer W. For example, the time of supplying the high-temperature chemical liquid to the center of the front surface of wafer W where the temperature of wafer W easily increases may be shorter than that of supplying it to the circumference of the back surface of wafer W to improve the temperature uniformity.

If chemical-liquid discharge nozzle 5 disposed at the rear side of wafer W is the conventional type that discharges the high-temperature chemical liquid to the center of the back surface of wafer W, the temperature variation of the back surface of wafer W increases as described above, thereby also affecting to the front surface. Therefore, even by scanning front-surface chemical-liquid discharge nozzle 8, there is a limitation on the uniformity of the temperature of the front surface of wafer W, so that it may fails to achieve the sufficient etching uniformity on the front surface of wafer W. However, in the present embodiment, three outlets 18a, 18b, and 18c are formed on chemical-liquid discharge nozzle 5 disposed at the rear side of wafer W so that the chemical liquid contacts with the places in different distances from the center of wafer W, other than the center of wafer W. Therefore, it is possible to increase the temperature uniformity of the back surface of wafer W, thereby further improving the etching uniformity of the front surface of wafer W.

Further, the present disclosure is not limited to the above embodiments, and can be variously modified. For example, in the above embodiments, three outlets are provided on chemical-liquid discharge nozzle 5, but the number of outlets may be plural, such as two (2) or four (4) or more.

Figure 8:
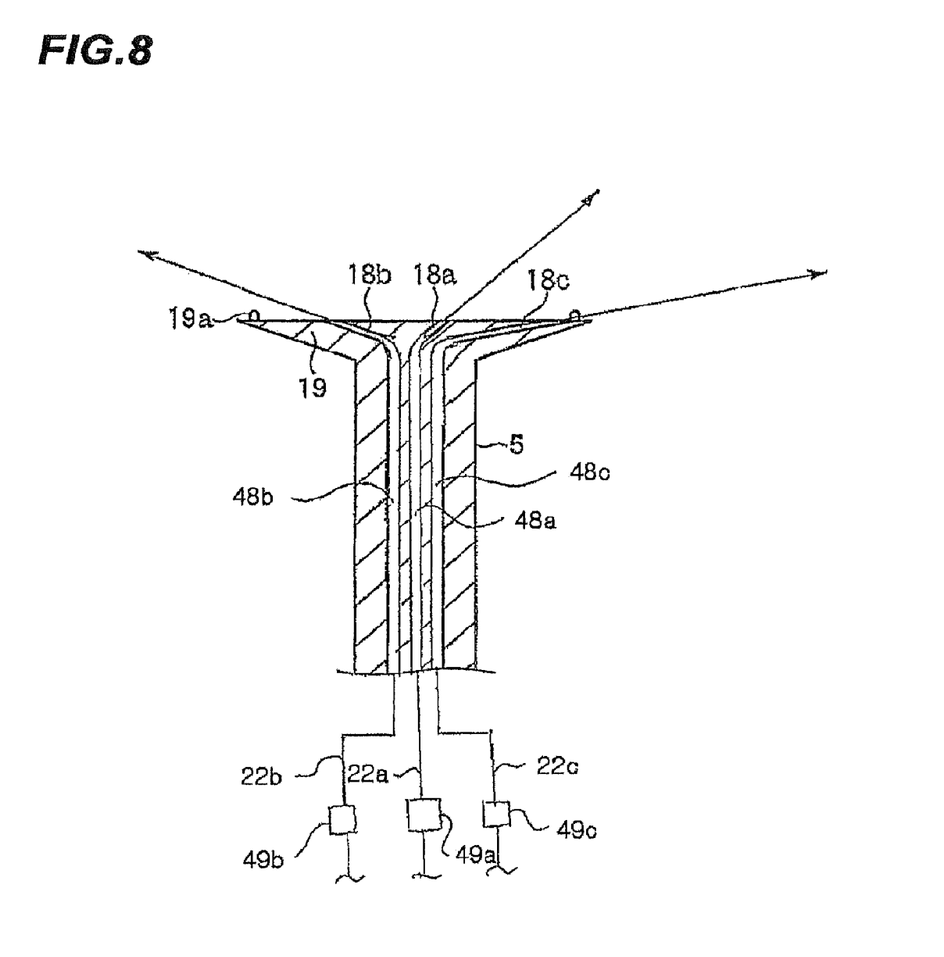
FIG. 8 is a cross-sectional view illustrating another example of the chemical-liquid discharge nozzle.

In the above-described examples, a plurality of outlets is formed in the single nozzle hole. However, a plurality of nozzle holes may be formed and a plurality of outlets may be formed at each nozzle hole. For example, as shown in FIG. 8, three nozzle holes 48a, 48b, and 48c extend along the longitudinal direction of chemical-liquid discharge nozzle 5 within chemical-liquid discharge nozzle 5 and each of outlets 18a, 18b, and 18c is connected with each of nozzle holes 48a, 48b, and 48c, respectively. The chemical-liquid tank separately supplies the chemical liquid to nozzle holes 48a, 48b, and 48c through chemical-liquid conduits 22a, 22b, and 22c, respectively, and flow control devices 49a, 49b, and 49c are provided at chemical-liquid conduits 22a, 22b, and 22c, respectively. According to this example, since the flow rate of the chemical liquid discharged from the discharge hole can be adjusted separately, the minute temperature control of the back surface of wafer W can be performed.

Further, the combination of a to-be-etched film and a high-temperature chemical liquid is not limited to the above examples. Further, the semiconductor wafer is used for the to-be-processed substrate in the above embodiments, but other substrates, such as a substrate for a Flat Panel Display (FPD) including a glass substrate for the Liquid Crystal Display (LCD), may be used as the to-be-processed substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A chemical-liquid processing apparatus to remove a film formed on a substrate, the apparatus comprising:
   a substrate holding mechanism to hold the substrate horizontally in a state where a back surface of the substrate faces downward;
   a rotating mechanism to rotate the substrate holding mechanism by a hollow rotating shaft extending vertically, the hollow rotating shaft being positioned perpendicular to the center of the back surface of the substrate;
   a back-surface chemical-liquid discharge nozzle positioned within the hollow rotating shaft to supply a back-surface liquid to the back surface of the substrate by discharging the back-surface liquid upwardly, the back-surface chemical-liquid discharge nozzle having an upper end and a lower end, with a hole running axially between the two ends; and
   a chemical-liquid supply mechanism to supply the back-surface liquid to the hole at the lower end of the back-surface chemical-liquid discharge nozzle,
   wherein the back-surface chemical-liquid discharge nozzle includes at its upper end a substrate supporting part, within which are formed a plurality of outlets that commence at the axis of the hole, and proceed upwardly through the substrate supporting part at an acute angle to the axis of the hole, such that the outlets discharge the back-surface liquid to a plurality of contacting places on the back surface of the substrate.

2. The chemical-liquid processing apparatus of claim 1, wherein the apparatus selects either a high-temperature chemical liquid or a rinsing liquid as the back-surface liquid.

3. The chemical-liquid processing apparatus of claim 1, wherein the back-surface liquid is a high-temperature chemical liquid, and wherein the outlets are configured so that thermal hysteresis of the back surface of the substrate becomes uniform in the back surface of the substrate as the high-temperature chemical liquid discharged from the outlets contacts with and expands on the back surface of the substrate.

4. The chemical-liquid processing apparatus of claim 3, wherein the outlets are configured so that one of the contacting places is where the temperature of the chemical liquid expanded from another contacting place starts to decrease.

5. The chemical-liquid processing apparatus of claim 1, wherein the back-surface chemical-liquid discharge nozzle is installed to move up and down, the apparatus is configured so that the substrate is transferred on the substrate supporting part to a carrying position when the back-surface chemical-liquid discharge nozzle moves up, and the back-surface chemical-liquid discharge nozzle is located at a lower position during the processing and moves up to lift the substrate to the carrying position after the processing.

6. The chemical-liquid processing apparatus of claim 1, the apparatus further comprising:
   a front-surface chemical-liquid discharge nozzle to discharge a front-surface liquid to a front surface of the substrate, the front-surface chemical-liquid discharge nozzle being installed above the substrate held by the substrate holding mechanism and being configured to scan the substrate; and
   a front-surface chemical-liquid supply mechanism to supply the front-surface liquid to the front-surface chemical-liquid discharge nozzle.

7. The chemical-liquid processing apparatus of claim 6, wherein the apparatus selects either a high-temperature chemical liquid or a rinsing liquid as the front-surface liquid.

8. The chemical-liquid processing apparatus of claim 6, wherein the apparatus is configured to etch the substrate by selecting a high temperature chemical liquid as the back-surface and front-surface liquids, and by supplying those liquids as the rotating mechanism rotates the substrate holding mechanism.

9. The chemical-liquid processing apparatus of claim 1, wherein the back-surface liquid is a high-temperature chemical liquid source is provided with a heater.

10. The chemical-liquid processing apparatus of claim 1, wherein each of the plurality of outlets is provided with a corresponding nozzle hole of a plurality of nozzle holes, respectively.

11. The chemical-liquid processing apparatus of claim 10, wherein each of a plurality of chemical-liquid conduits supplying chemical liquid to each of the plurality of nozzle holes is provided with a separate flow control device.

* * * * *